United States Patent
Refai-Ahmed et al.

(10) Patent No.: US 9,812,374 B1
(45) Date of Patent: Nov. 7, 2017

(54) THERMAL MANAGEMENT DEVICE WITH TEXTURED SURFACE FOR EXTENDED COOLING LIMIT

(71) Applicant: Xilinx, Inc., San Jose, CA (US)

(72) Inventors: Gamal Refai-Ahmed, Santa Clara, CA (US); Suresh Ramalingam, Fremont, CA (US); Brian D. Philofsky, Longmont, CO (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/466,495

(22) Filed: Mar. 22, 2017

(51) Int. Cl.
| | |
|---|---|
| H01L 23/12 | (2006.01) |
| H01L 21/00 | (2006.01) |
| H05K 7/20 | (2006.01) |
| H01L 23/367 | (2006.01) |
| H01L 23/427 | (2006.01) |
| H01L 25/065 | (2006.01) |
| H01L 23/373 | (2006.01) |
| H01L 21/48 | (2006.01) |

(52) U.S. Cl.
CPC ...... H01L 23/3675 (2013.01); H01L 21/4882 (2013.01); H01L 23/3677 (2013.01); H01L 23/3736 (2013.01); H01L 23/3737 (2013.01); H01L 23/427 (2013.01); H01L 25/0655 (2013.01)

(58) Field of Classification Search
CPC ............. H01L 23/3677; H01L 21/4882; H01L 23/3675; H01L 23/3736; H01L 23/3737; H01L 23/23427
See application file for complete search history.

(56) References Cited

U.S. PATENT DOCUMENTS

| 5,825,087 A * | 10/1998 | Iruvanti | H01L 21/4878 257/706 |
| 6,437,437 B1 * | 8/2002 | Zuo | F28D 15/0233 257/704 |

(Continued)

OTHER PUBLICATIONS

U.S. Appl. No. 14/867,349, filed Sep. 28, 2015, Refai-Ahmed et al.

(Continued)

Primary Examiner — Alonzo Chambliss
(74) Attorney, Agent, or Firm — Steven Roberts; Keith Taboada (57) ABSTRACT

Methods and apparatus are described for heat management in an integrated circuit (IC) package using a device with a textured surface having multiple grooves in an otherwise relatively flat surface. The textured surface of the heat management device is designed, in conjunction with a thermal interface material (TIM), to push gas bubbles out of the flat areas such that the gas bubbles are trapped in the grooves or driven out of the interface between the device and the TIM altogether. The area of the grooves is small relative to the ungrooved areas (i.e., the flat areas), such that when the gas bubbles are trapped in the grooved areas, the ungrooved areas work even better for heat transfer. With the area of the regions for the flat portions being substantially greater than the area of the regions for the grooves, the textured heat management device is designed to lower thermal resistance, increase thermal conductivity, and increase heat transfer from one or more IC dies to a heat sink assembly in an IC package.

20 Claims, 8 Drawing Sheets

(56) References Cited

U.S. PATENT DOCUMENTS

| | | | |
|---|---|---|---|
| 6,437,438 B1* | 8/2002 | Braasch | H01L 23/367 257/701 |
| 6,607,942 B1* | 8/2003 | Tsao | H01L 23/3128 257/707 |
| 7,491,577 B2 | 2/2009 | Sturcken et al. | |
| 9,287,141 B2 | 3/2016 | Dahlstrom | |
| 9,418,909 B1* | 8/2016 | Chaware | H01L 24/32 |
| 2006/0227510 A1* | 10/2006 | Fitzgerald | H01L 23/42 361/704 |
| 2006/0238984 A1* | 10/2006 | Belady | H01L 23/367 361/704 |
| 2008/0274349 A1* | 11/2008 | Chiu | H01L 23/3737 428/327 |
| 2013/0168844 A1* | 7/2013 | Stanley | H01L 23/3733 257/712 |
| 2014/0264820 A1* | 9/2014 | Hu | H01L 23/3736 257/713 |
| 2015/0279761 A1* | 10/2015 | Bet-Shliemoun | H01L 23/42 257/714 |

OTHER PUBLICATIONS

U.S. Appl. No. 15/369,607, filed Dec. 5, 2016, Refai-Ahmed et al.
Ventola, L. et al., Micro-structured rough surfaces by laser etching for heat transfer Journal of Physics: Conference Series 525 (2014) 012017, Eurotherm Seminar 102: Thermal Management of Electronic Systems, IOP Publishing, 10 pgs.,etrieved Mar. 21, 2017 from URL: http://iopscience.iop.org/article/10.1088/1742-6596/525/1/012017/pdf.
Conard Corporation, "Photo Etching PCB Heatsinks", retrieved Mar. 21, 2017 from URL: http://www.conardcorp.com/photo-etched-heatsinks.

* cited by examiner

THERMAL MANAGEMENT DEVICE WITH TEXTURED SURFACE FOR EXTENDED COOLING LIMIT

TECHNICAL FIELD

Examples of the present disclosure generally relate to integrated circuit packaging and, more particularly, to integrated circuit packaging using a thermal management device with a textured surface.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include memory, logic, and/or any of various other suitable circuit types.

Many integrated circuits and other semiconductor devices utilize an arrangement of bumps, such as a ball grid array (BGA) or a flip chip ball grid array (FCBGA), for surface mounting packages to a circuit board (e.g., printed circuit board (PCB). Any of various suitable package pin structures, such as controlled collapse chip connection (C4) bumps or microbumps (as used in stacked silicon interconnect (SSI) applications), may be used to conduct electrical signals between a channel on an integrated circuit (IC) die (or other package device) and the circuit board on which the package is mounted.

As the density of active components in IC dies continues to rise, the IC dies produce an ever-increasing amount of heat during operation. This heat is typically thermally conducted from the IC dies through a thermal interface material (TIM) to a lid and then to a heat sink to facilitate heat dissipation away from the IC dies. Heat spreaders (e.g., vapor chambers) may be used to spread heat from a concentrated heat source such as an IC die to a larger heat sink.

SUMMARY

One example of the present disclosure is a heat management device. The heat management device generally includes a textured surface having a plurality of grooves disposed in an otherwise flat surface, a combined area of regions with the grooves in the textured surface being significantly smaller than a combined area of regions with the flat surface.

Another example of the present disclosure is an integrated circuit (IC) package. The IC package generally includes a package substrate; one or more IC dies disposed above the package substrate; a thermal interface material (TIM) disposed above the IC dies; and a heat management device disposed above the TIM and comprising a textured surface having a plurality of grooves disposed in an otherwise flat surface, a combined area of regions with the grooves in the textured surface being significantly smaller than a combined area of regions with the flat surface.

Yet another example of the present disclosure is a method of fabricating an IC package. The method generally includes forming a plurality of grooves in an otherwise flat surface of a metal plate to form a heat management device having a textured surface, disposing a TIM above one or more IC dies disposed above a package substrate, and disposing the heat management device above the TIM, wherein a combined area of regions with the grooves in the textured surface is significantly smaller than a combined area of regions with the flat surface.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, where possible, to designate identical elements that are common to the figures. It is contemplated that elements of one example may be beneficially incorporated in other examples.

DETAILED DESCRIPTION

Examples of the present disclosure provide apparatus and techniques for heat management using a device with a textured surface having multiple grooves in an otherwise relatively flat surface. The textured surface of the heat management device is designed, in conjunction with a thermal interface material (TIM), to push any gas bubbles out of the flat areas such that the gas bubbles are trapped in the grooves or driven out of the interface between the device and the TIM altogether. The area of the grooves is small relative to the ungrooved areas (i.e., the flat areas), such that when the gas bubbles are trapped in the grooved areas, the ungrooved areas work even better for heat transfer. With the area of the regions for the flat portions being substantially greater than the area of the regions for the grooves, the textured heat management device is designed to lower thermal resistance, increase thermal conductivity, and increase heat transfer from an IC die to a heat sink assembly in an IC package.

Example Integrated Circuit Packages

Figure 1A:
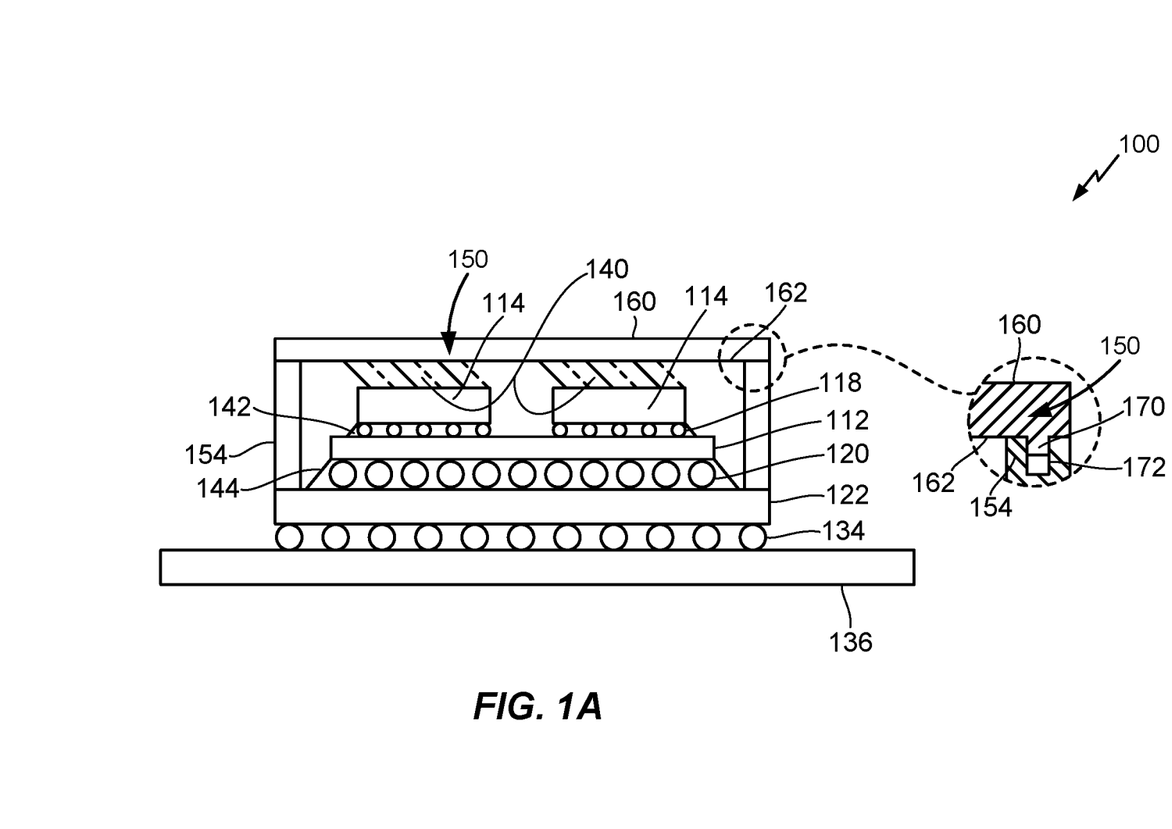
FIG. 1A is a cross-sectional view of an example integrated circuit (IC) package including one or more IC dies covered by a lid, in accordance with an example of the present disclosure.

Turning now to FIG. 1A, an example integrated circuit (IC) package 100 is illustrated. The IC package 100 includes one or more IC dies 114 (also referred to as "chips") connected optionally by an interposer 112 to a package substrate 122. Although two IC dies 114 are shown in FIG. 1A, the number of IC dies may range from one to as many as can be fit within the IC package 100.

The interposer 112 includes circuitry for electrically connecting the IC dies 114 to circuitry of the package substrate 122. The interposer 112 may be passive and contain interconnects (not shown) for connecting one of the IC dies 114 to another and/or through-silicon vias (TSVs) for connecting each of the IC dies to the package substrate 122. For other examples, the interposer 112 may be active and include transistors. Package bumps 120, also known as "controlled collapse chip connection (C4) bumps," are utilized to provide an electrical connection between the circuitry of the interposer 112 and the circuitry of the package substrate 122. The package substrate 122 may be mounted and connected to a printed circuit board (PCB) 136, utilizing solder balls 134, wire bonding, or any other suitable technique. For some examples, an undermolding 144 may be utilized to fill the space not taken by the package bumps 120 between the package substrate 122 and the interposer 112, thereby providing structural rigidity to the IC package 100.

The IC dies 114 are mounted to one or more surfaces of the interposer 112, or alternatively in examples wherein an interposer is not utilized, to the package substrate 122. The IC dies 114 may be programmable logic devices (e.g., field programmable gate arrays (FPGAs)), memory devices, optical devices, processors, or other IC structures. Optical devices include photodetectors, lasers, optical sources, and the like. In the example depicted in FIG. 1A, the IC dies 114 are mounted to a top surface of the interposer 112 by a plurality of microbumps 118. The microbumps 118 electrically connect the circuitry of each IC die 114 to circuitry of the interposer 112. The circuitry of the interposer 112 connects the microbumps 118 to selective package bumps 120, and hence, connects selective circuitry of each IC die 114 to the package substrate 122, to enable communication of the IC dies 114 with the PCB 136, for example, after the IC package 100 is mounted within an electronic device (not shown). When the optional interposer 112 is not present, the microbumps 118 may connect selective circuitry of each IC die 114 to the package substrate 122 to enable communication of the IC dies 114 with the PCB 136. For some examples, an undermolding 142 may be utilized to fill the space not taken by the microbumps 118 between the IC dies 114 and interposer 112 to provide structural rigidity to the IC package 100.

The IC package 100 may additionally include a stiffener 154. The stiffener 154 may be coupled to the package substrate 122 and circumscribe the IC dies 114. The stiffener 154 can extend to peripheral edges of the package substrate 122 to provide mechanical support, which helps prevent the IC package 100 from bowing and warpage. The stiffener 154 may be a single-layer structure or a multi-layer structure. The stiffener 154 may be made of ceramic, metal, or other various inorganic materials, such as aluminum oxide ($Al_2O_3$), aluminum nitride (AlN), silicon nitride (SiN), silicon (Si), copper (Cu), aluminum (Al), diamond, and stainless steel, among other materials. The stiffener 154 can also be made of organic materials such as copper-clad laminate.

A lid 150 may be disposed over the IC dies 114. In some examples, the lid 150 may be fabricated from a plastic material or other suitable material. In other examples, particularly where it is desirable to utilize the lid 150 to receive and convey heat away from the IC dies 114, the lid 150 may be fabricated from a thermally conductive material, such as copper, nickel-plated copper, or aluminum, among other suitable materials. The lid 150 may have a thickness of between about 0.5 mm and about 3.0 mm, although other thicknesses may be utilized.

The lid 150 has a top surface 160 and a bottom surface 162. For some examples, the top surface 160 forms the exterior top surface of the IC package 100. The bottom surface 162 faces the IC dies 114. A heat sink (not shown in FIG. 1A) may optionally be mounted to the top surface 160 of the lid 150.

Generally, the lid 150 is disposed over the IC dies 114. A thermal interface material (TIM) 140 may be utilized to thermally and/or mechanically couple the lid 150 to the IC dies 114. The TIM 140 may be selected to provide a thermally conductive path between the lid 150 to the IC dies 114 so that heat generated by the IC dies 114 may be dissipated through the lid 150. The TIM 140 is generally a heat transfer material having a conductivity of at least about 0.1 W/m·K and is designed to displace the air that is present in the gaps between the lid 150 and the IC dies 114, thereby decreasing the thermal contact resistance. Examples of materials suitable for use as the TIM 140 include thermal grease, thermally conductive epoxy, phase-change materials (PCMs), conductive tapes, and silicone-coated fabrics among other suitable materials. The TIM 140 may be a soft or compliant adhesive to allow compensation between mismatched heights of neighboring IC dies 114 within the IC package 100. In one example, the TIM 140 may be a thermal gel or thermal epoxy, such as packaging component attach adhesives available from AI Technology, Inc., located in Princeton Junction, N.J. In another example, the TIM 140 may be a phase-change material, such as Tpcm 780 or Tpcm 780SP available from Laird PLC of London, United Kingdom.

The lid 150 may also be disposed over the stiffener 154. In some implementations, the lid 150 may be bonded to the stiffener 154 by an adhesive (not shown), such as an epoxy.

In other implementations, the lid 150 is located relative to the stiffener 154 by a pin 170. The pin 170 may be attached to only one of the lid 150 and the stiffener 154, so that the lid 150 and stiffener are mechanically decoupled. This mechanical decoupling allows the lid 150 to move freely (i.e., "float") relative to the stiffener 154. In this manner, stresses between the lid 150 and the stiffener 154 are mechanically decoupled, resulting in less warpage and delamination of the various layers and components of the IC package 100.

In the example depicted in FIG. 1A, the pin 170 is attached to the lid 150. For example, the pin 170 may be bonded, screwed in, force fit, or otherwise attached to the lid 150. The pin 170 may extend from the bottom surface 162 of the lid 150 into a clearance hole 172 formed in a top of the stiffener 154 to allow the lid 150 to move relative to the stiffener 154. In some implementations, the pin 170 is an integral part of the lid 150. For example, the pin 170 may be formed by stamping the lid 150 to project the pin 170 from the bottom surface 162 of the lid 150. In another example, the pin 170 may be a projection formed during 3D printing of the lid 150.

Figure 1B:
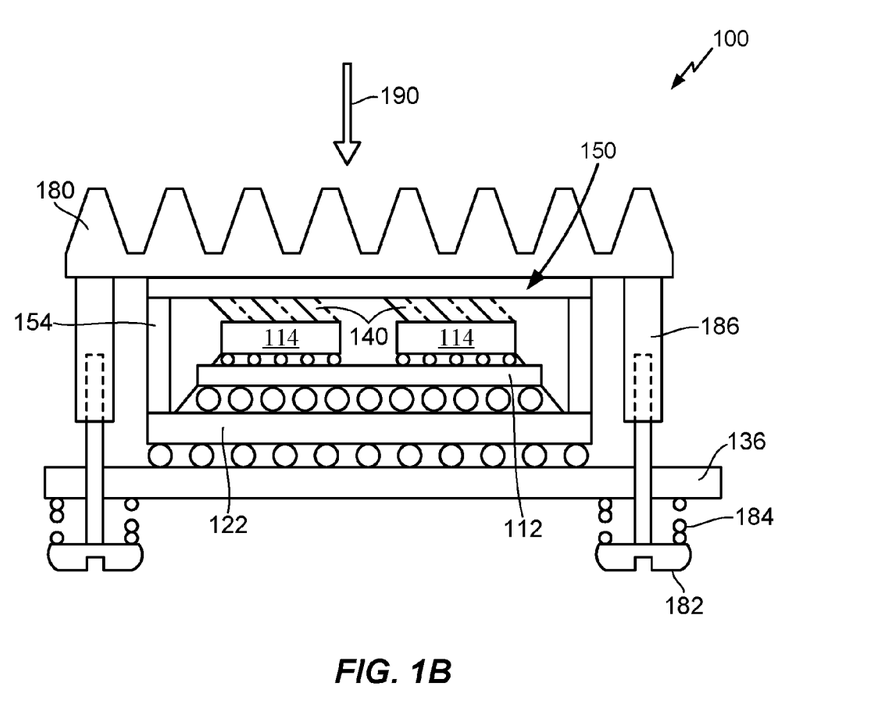
FIG. 1B is a cross-sectional view of the IC package of FIG. 1A with a heat sink mounted to a printed circuit board, in accordance with an example of the present disclosure.

FIG. 1B is a cross-sectional view of the IC package 100 of FIG. 1A with a heat sink assembly 180 mounted to the printed circuit board 136. The heat sink assembly 180 is coupled to the printed circuit board 136 in a manner that secures the lid 150 to the stiffener 154. In some implementations, a fastener 182 may be threadingly engaged with posts 186 of the heat sink assembly 180 so that the heat sink assembly exerts a force on the lid 150 in a direction of the dies 114, as illustrated by arrow 190. Optionally, a spring 184 or other resilient object may be disposed between the fastener 182 and the printed circuit board 136 to provide force that the heat sink assembly 180 exerts on the lid 150. Advantageously, the force provided by the heat sink assembly 180 allows the lid 150 to maintain good thermal contact with the dies 114, while remaining floating on the stiffener 154.

Example Textured Thermal Management Device

As described above, conventional engineering practices may involve applying a TIM 140 between two surfaces, either metal-to-metal or metal-to-semiconductor (e.g., silicon). The TIM 140 may include organic materials such as a thermal grease (e.g., G750 from Shin-Etsu Chemical Co., Ltd. of Tokyo, Japan) or thermal phase-change materials (e.g., Tpcm 780 from Laird, which can be used as a preform or paste). However, this approach can cause air (or potentially other gases) to be trapped in the interface, which may result in micro- or sub-micro-scale air voids. Also, the physical nature of the surfaces (e.g., the surface roughness) that the TIM 140 is applied in between may not permit achieving the smallest bound line thickness (BLT) between the contact surfaces.

Figure 2A:
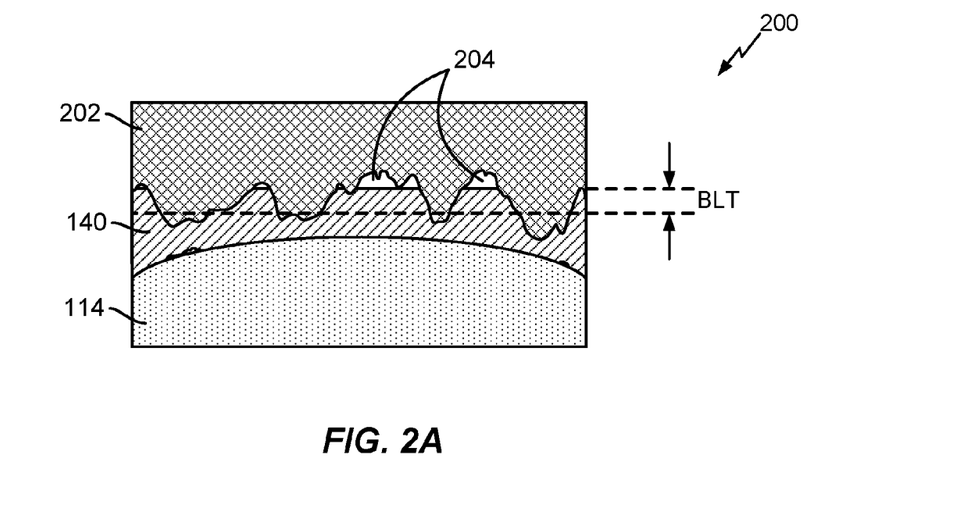
FIG. 2A is a cross-sectional view of a portion of an example IC package, illustrating air voids between a heat sink and an IC die with the use of a thermal interface material (TIM).
Figure 2B:
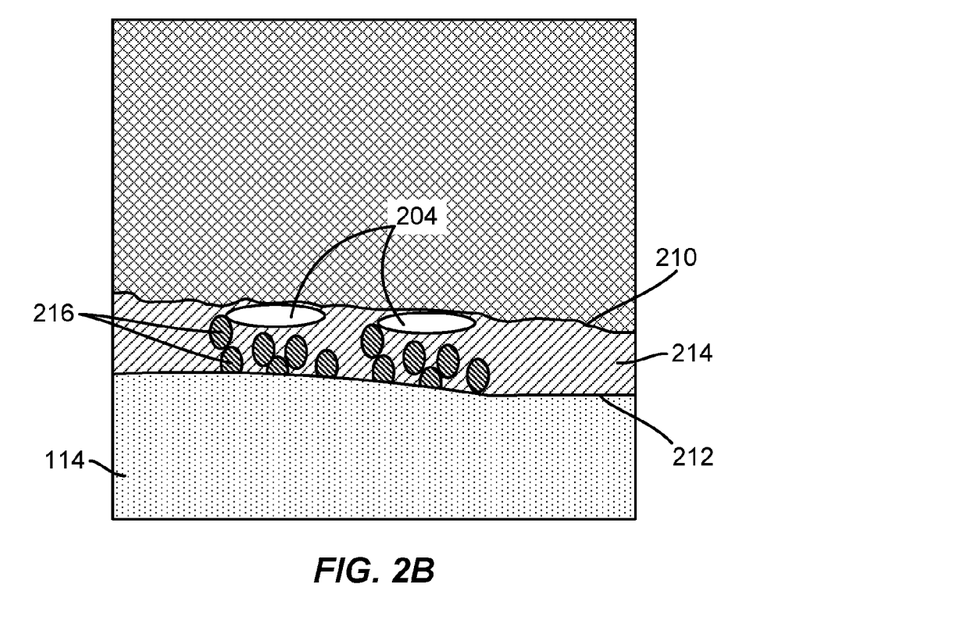
FIG. 2B is a conceptual diagram for the concepts illustrated in FIG. 2A.

FIG. 2A is a cross-sectional view of a portion of an example IC package 200 illustrating air voids 204 between a metal layer 202 (e.g., a heat sink) and an IC die 114 with the use of a TIM 140. The metal layer 202 has a particular surface roughness, and the use of the TIM 140 may trap gases in the voids 204. FIG. 2B is a conceptual diagram for the concepts illustrated in FIG. 2A when the two surfaces 210, 212 (e.g., of the overlying metal and underlying semiconductor die) are flat. The TIM 140 may be engineered as a mixture of one or more polymers and metal particles. In this case, the TIM may exhibit physical behaviors characteristic of a phase-change material (PCM). For example, a PCM 214 may be located between the two surfaces 210, 212 and may comprise metal particles 216 (e.g., of alumina, aluminum, or other suitable materials). For some examples, the metal particles 216 may have a diameter of 25 µm or less. The PCM 214 may trap air between the surface 210 and the PCM, thereby creating air voids 204. When the PCM 214 (e.g., comprising a polymer) is softening as the PCM heats up, the particles 216 may sink toward the lower surface 212, and the air voids 204 (e.g., bubbles) are consequently pushed toward the upper surface 210. The air voids 204 create air layers that prevent heat from moving from the lower surface 212 to the upper surface (which may be thermally connected to a cooling plate or other heat sink) in an effort to actively dissipate the heat. Therefore, current engineering practices may not be capable of reducing the thermal contact resistance between two such surfaces in the presence of air voids 204.

Examples of the present disclosure provide a heat management device with a textured surface having multiple grooves in an otherwise relatively flat surface. The textured heat management device is designed, in conjunction with a thermal interface material (TIM), to push the gas bubbles out of the flat areas such that the gas bubbles are trapped in the grooves. The grooved areas may be noticeably small relative to the ungrooved areas (i.e., the area of the flat portions), such that when the gas bubbles are trapped in the grooved areas, the ungrooved areas have lower thermal resistance and thus work even better for heat transfer. With the area of the regions for the flat portions being substantially greater than the area of the regions for the grooves, the textured heat management device is designed to lower thermal resistance, increase thermal conductivity, and increase heat transfer from an IC die to a heat sink assembly in an IC package.

Figure 3A:
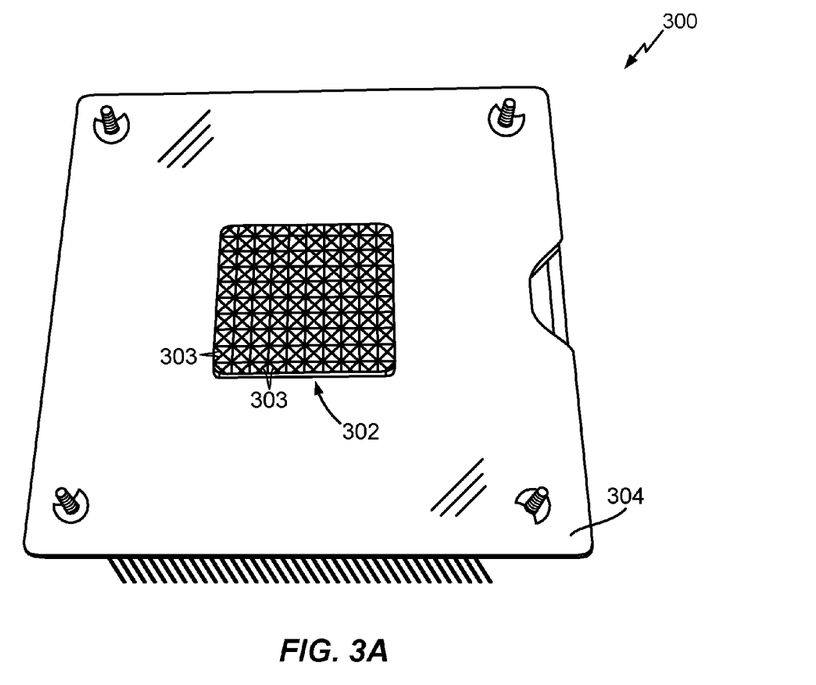
FIG. 3A is a bottom view of an example textured heat management device disposed adjacent a heat sink assembly, in accordance with an example of the present disclosure.
Figure 3B:
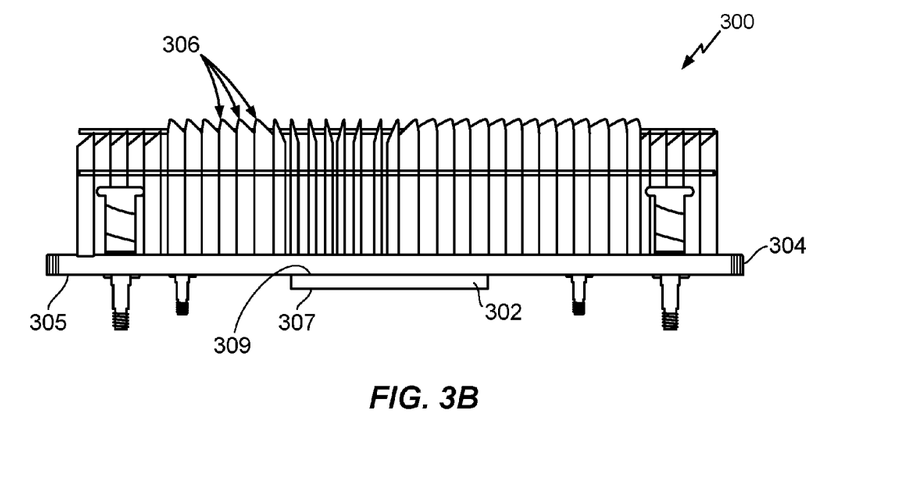
FIG. 3B is a side view of the example heat sink assembly of FIG. 3A, in accordance with an example of the present disclosure.

FIG. 3A is a bottom view of an example textured heat management device 302 disposed adjacent a heat sink assembly 300, in accordance with an example of the present disclosure. FIG. 3B is a side view of the example heat sink assembly 300 of FIG. 3A, in accordance with an example of the present disclosure. The heat sink assembly 300 may include a heat sink base plate 304, to which multiple heat sink fins 306 have been attached. The base plate 304 may be a lid (e.g., lid 150) of an IC package. The base plate 304 may comprise any of various suitable metals, such as copper (Cu) or aluminum (Al). For some examples, the base plate 304 may be embedded with one or more heat pipes and/or comprise a vapor chamber, for heat spreading.

For some examples, the heat management device 302 may be a separate piece that is attached (e.g., soldered) to the base plate 304, whereas in other examples, the heat management device 302 may be an integral part of the base plate 304. Although the heat management device 302 is illustrated as being protruded from the lower surface 305 of the base plate 304 in the example of FIGS. 3A and 3B, for other examples, the heat management device 302 may be flush with or counter sunk in the lower surface 305 of the base plate 304. The upper surface 309 of the heat management device 302 may be plated with nickel (Ni) or another suitable material for preventing corrosion and/or for permitting the device to be soldered to the base plate 304.

The heat management device 302 may have a pattern of grooves 303 (which may also be referred to as channels or microchannels) formed in the lower surface 307 of the device. The heat management device 302 may comprise a mass (e.g., a plate or disc) of a suitable metal, such as Cu or Al. The grooves 303 may be formed in the metal mass via etching or any other suitable method. For some examples, the grooves 303 may be arranged in rows, in columns, as positive-sloping diagonals, as negative-sloping diagonals, or as a combination thereof, with respect to a particular orientation of the device 302. In the example of FIG. 3A, the heat management device 302 has a first set of grooves arranged in rows, a second set of grooves arranged in columns perpendicular to and intersecting the rows at intersections, a third set of grooves arranged in positive-sloping diagonals intersecting the intersections between the rows and the columns, and a fourth set of grooves arranged in negative-sloping diagonals intersecting the same intersections. For some examples, the grooves 303 may have a depth on the order of 0.1 mm, and intersections of more than two grooves may have a depth on the order of 0.2 mm.

Contact due to the textured surface of the heat management device 302 with the PCM 214 vents gasses more easily and quickly, resulting in less gas trapped in the interface (e.g., air voids 204 are fewer and/or smaller in volume). The PCM 214 may be manufactured as a blend of hydrocarbon polymers to provide a material that has slight melting, but is mostly an amorphous solid that softens with temperature and does not suddenly change from a solid to a liquid state. One or more of these polymers may contain metal powder and/or ceramic fillers, which may be greater than 90% of the PCM 214 by weight. The fillers may have a maximum particle size of 25 μm. The filler and polymer may be engineered to offer a combined effect of a shear thinning material that may be described as thixotropic, meaning the material does not change shape even at elevated temperatures without being acted on by a force and does not self-level. The viscosity of the PCM 214 may be a function of temperature and may change most notably around 50 to 55° C. under a load of about 10 psi or higher. This results in the material furthest away from the heat source having higher viscosity than material nearer the heat source. Therefore the polymer is engineered to act as a Newtonian fluid with a viscosity in the range of 25000 centipoises (cP). For example, a PCM in the 780SP series from Laird may be used as the PCM 214.

The grooves 303 in the lower surface 307 of the heat management device 302 provide for the effective bond line thickness to be reduced compared to conventional solutions. In addition to introducing features for reducing the bond line thickness of the TIM, the surface 307 and the grooves 303 therein are engineered to eliminate, or at least reduce, the air voids in the TIM. Therefore, air voids are prevented from being trapped between the flat sections of the lower surface 307 and the semiconductor die (e.g., the IC die 114). As a result, this reduced bond line thickness does not allow gas to be trapped between two flat areas (e.g., between the lower surface 212 and a flat region on the textured surface of the heat management device 302). Consequently, the flat regions of the heat management device 302 work even better for heat transfer as compared to a heat management device with no grooves. Also, the grooves 303 provide more surface area of contact between the lower surface 307 of the heat management device 302 and the semiconductor die (e.g. the IC die 114).

Figure 4:
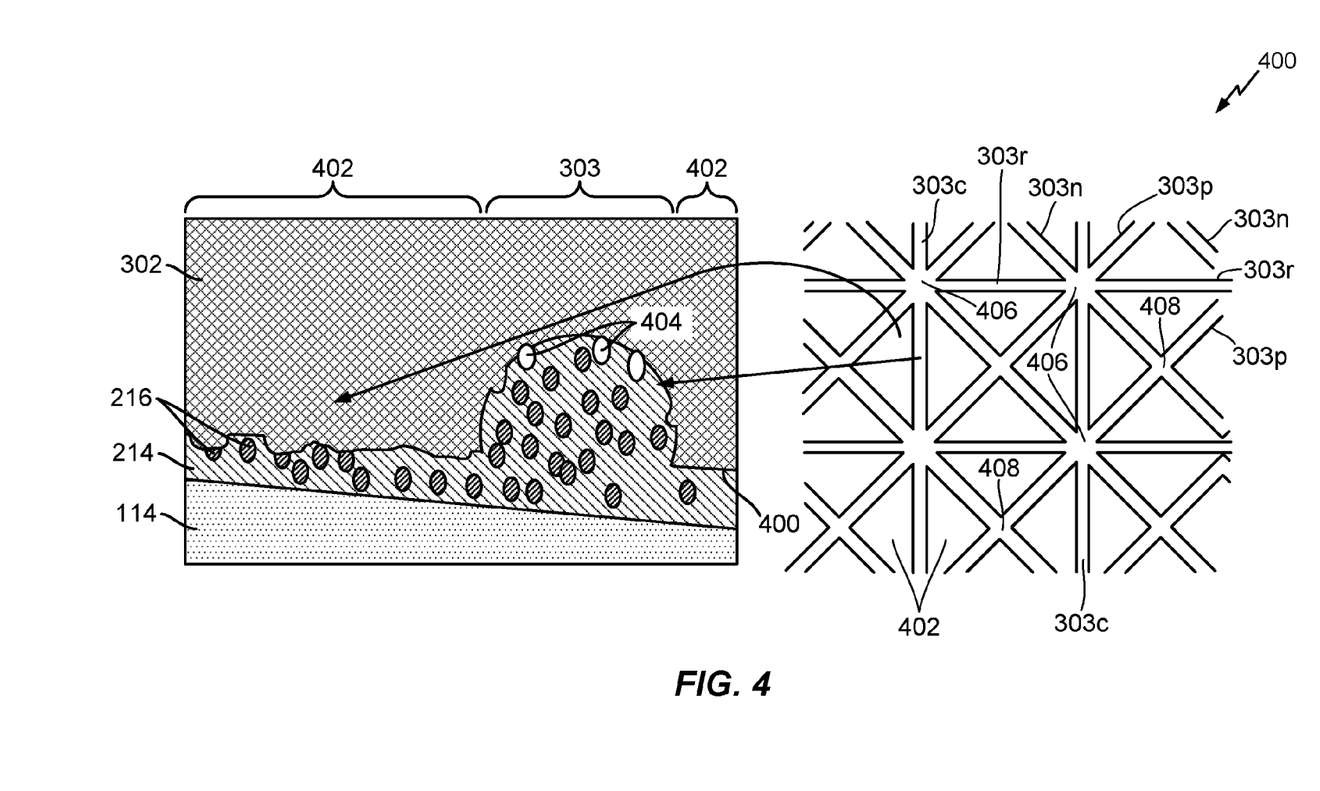
FIG. 4 illustrates a portion of the example textured heat management device of FIG. 3A in detail and provides a conceptual diagram of a groove and flat regions adjacent the groove in the textured device, in accordance with an example of the present disclosure.

FIG. 4 illustrates a portion of the textured surface 400 of the example heat management device 302 of FIG. 3A in detail and provides a conceptual diagram of a groove 303 and flat regions 402 adjacent the groove in the textured device, in accordance with an example of the present disclosure. As described above, the textured surface 400 includes grooves 303c arranged in columns and grooves 303r arranged in rows perpendicular to and intersecting the grooves 303c at intersections 406. These intersections 406 may have a depth of about 0.2 mm. The example textured surface 400 also includes grooves 303n arranged in diagonals having a negative slope (at least with respect to the orientation of the surface 400 in FIG. 4) and intersecting the intersections 406. The textured surface 400 also includes grooves 303p arranged in diagonals having a positive slope and intersecting the intersections 406. The grooves 303p and 303n may intersect each other not only at the intersections 406, but also at intersections 408 where the grooves 303c and 303r do not intersect. The flat regions 402 on the textured surface 400 are bounded by the grooves 303c, 303r, 303n, and/or 303p. As illustrated in FIG. 4, the combined area of regions with the grooves 303c, 303r, 303n, and/or 303p in the textured surface 400 are significantly smaller than (e.g., less than 40% of) the combined area of the flat regions 402.

FIG. 4 also shows that the polymer version of the PCM 214, which can enable the assembly while still wet, may act more similar to a Newtonian fluid than a preformed pad PCM version or a grease as the TIM. This is due to the fact that the viscosity of the polymer PCM is relatively low (e.g., ~25000 cP) and drops only slightly with shear, which may result in better flow of the metal particles 216 into the grooves 303, resulting in a thinner effective bond line thickness. This allows the air voids 404 to be eliminated in the flat regions 402 of the textured surface 400. The metal particles 216 may drive the air voids 404 to the grooves 303, and in some case, the momentum of the particles 216 may drive the air voids out of the grooves and/or break the air voids apart into smaller voids that cannot impact the heat transfer from the heat dissipated active surface (e.g., the lower surface 212) to the textured surface 400. With the combined textured surface 400 and PCM 214, the contact area, adhesion, and wetting in the flat regions 402 between the grooves 303 are enhanced versus that of the grooved surfaces due to the avoidance of potentially trapped air. Based on the combination of reduced air voids in the interface between surfaces, better wetting, and increased contact area, along with the effective thinner bond line thickness; the effective thermal conductivity of the heat management device 302 will be greater, resulting in a lower total thermal resistance between the IC die(s) and the surrounding environment. This leads to overall lower IC operating temperature.

Figure 5:
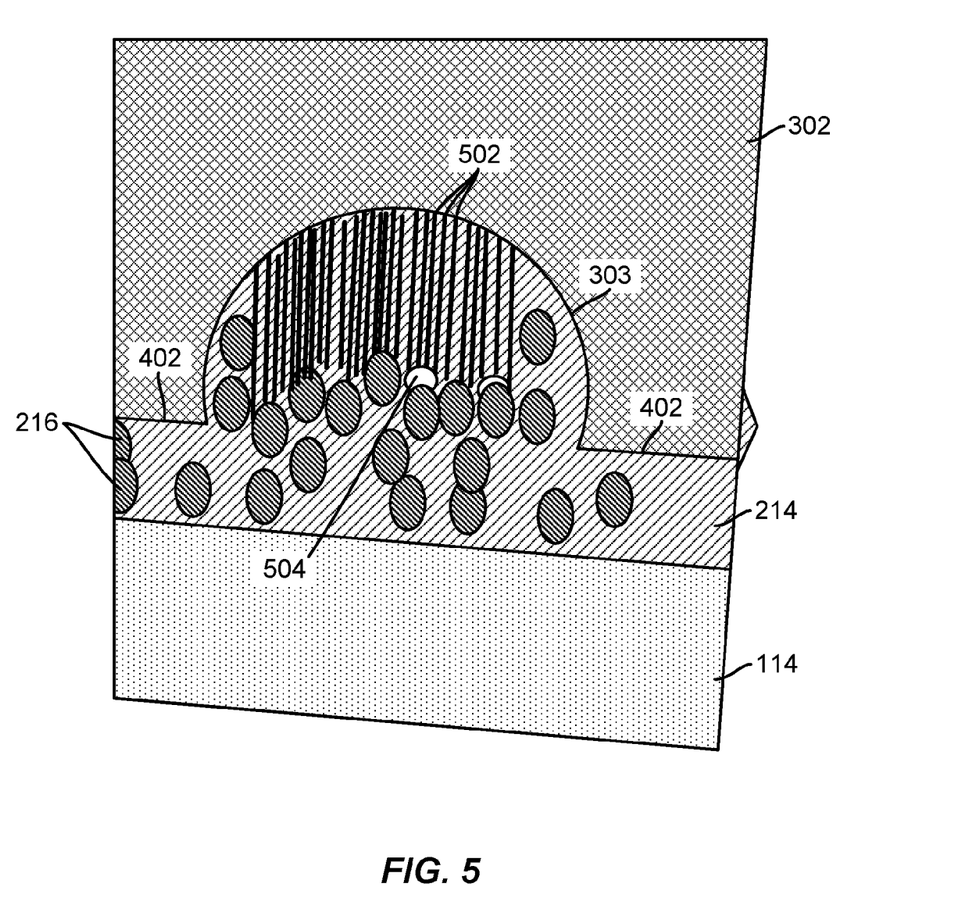
FIG. 5 is a conceptual diagram illustrating nanotubes disposed in a groove of the textured heat management device, in accordance with an example of the present disclosure.

For some examples, small structures may be disposed in the grooves 303 of the textured surface 400. For example, FIG. 5 illustrates nanotubes 502 (e.g., carbon nanotubes) disposed in a groove 303 of the heat management device 302, in accordance with an example of the present disclosure. The nanotubes 502 may offer an additional means for super thermal conductivity between polymer and metal particles 216 of the PCM 214 and the textured surface. Also, the nanotubes 502 may trap the gas in micro air voids 504 and/or break the air voids apart to a finer scale than shown in FIG. 5. This splitting action is due to the pressure applied on the air voids from all directions by the metal particles 216 (on the micron level) and the nanotubes 502 (on the nano level). In other words, the nanotubes 502 may act as a wedge to split the air voids 504 apart as the metal particles 216 force the air voids into the nanotubes. For some examples, the length (e.g., the height) of the nanotubes is less than 95% of the depth of the grooves 303. For some examples, all the grooves 303 may contain the nanotubes 502, while in other examples, only a portion of the grooves may contain nanotubes.

Figure 6:
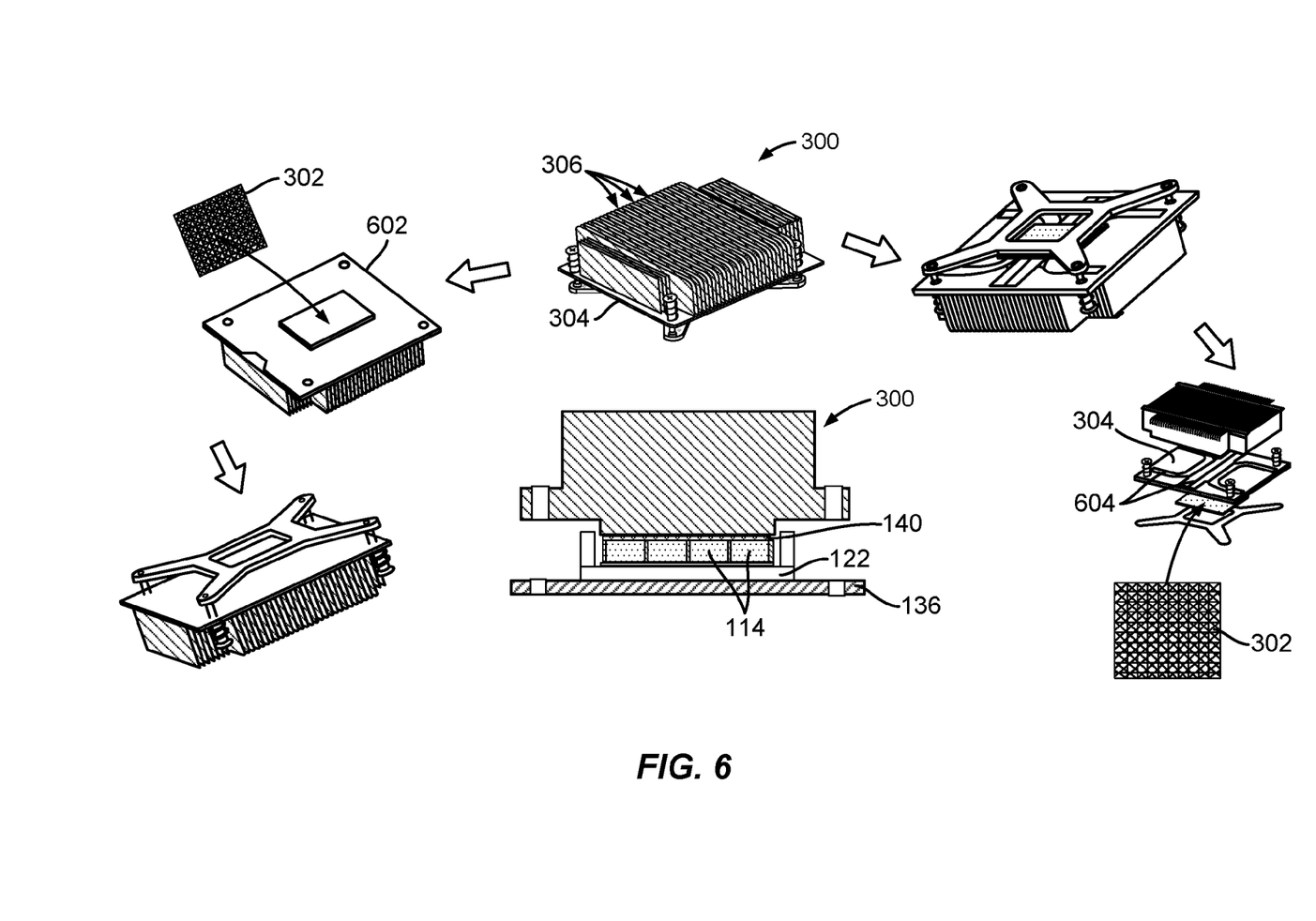
FIG. 6 illustrates the textured heat management device being employed in an example heat sink assembly implemented with an integrated vapor chamber or a heat pipe, in accordance with an example of the present disclosure.

As described above, the heat management device 302 may be employed in a heat sink assembly for heat dissipation away from one or more IC dies in an IC package. FIG. 6 illustrates the textured heat management device being employed in an example heat sink assembly 300 implemented with an integrated vapor chamber 602 or heat pipes 604 embedded in a base plate 304, in accordance with an example of the present disclosure.

Example Operations for Fabricating an IC Package

Figure 7:
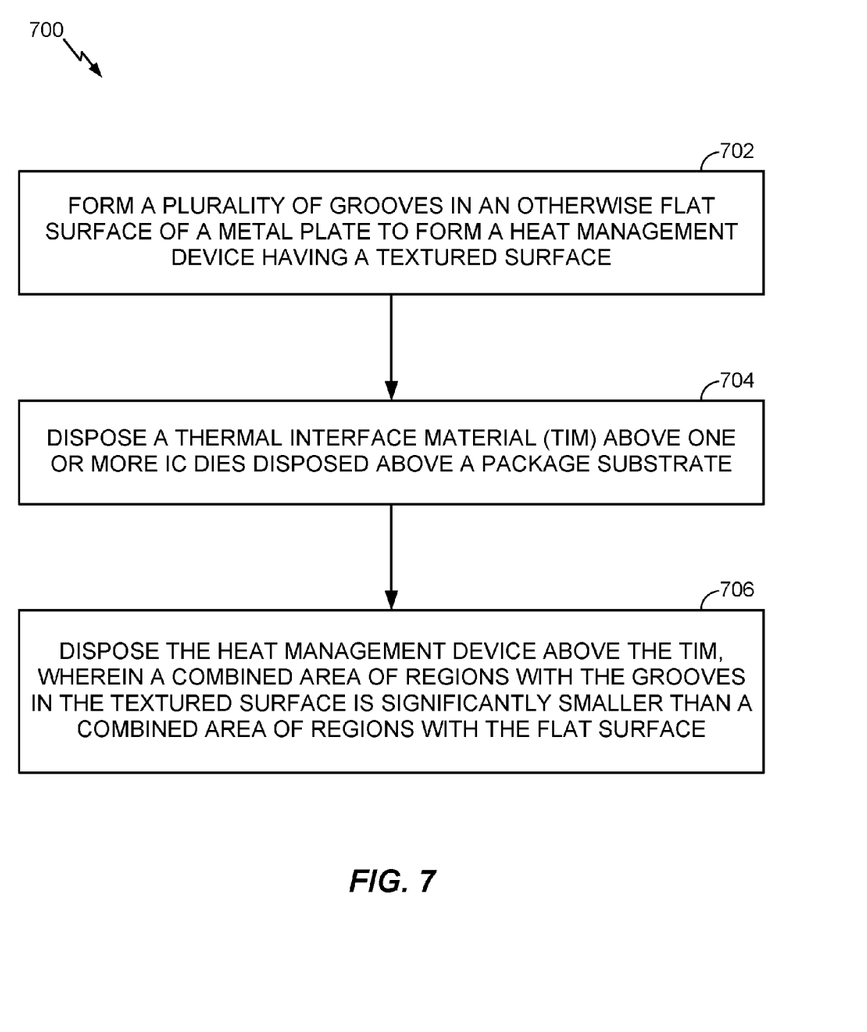
FIG. 7 is a flow diagram of example operations for fabricating an IC package with a heat management device, in accordance with an example of the present disclosure.

FIG. 7 is a flow diagram of example operations 700 for fabricating an IC package, in accordance with an example of the present disclosure. The operations 700 may begin, at block 702, by forming a plurality of grooves (e.g., grooves 303) in an otherwise flat surface of a metal plate to form a heat management device (e.g., device 302) having a textured surface (e.g., textured surface 400). At block 704, a TIM (e.g., TIM 140) is disposed above one or more IC dies (e.g., dies 114) disposed above a package substrate (e.g., substrate 122). At block 706, the heat management device is disposed above the TIM. A combined area of regions with the grooves in the textured surface is significantly smaller than a combined area of regions with the flat surface.

According to some examples, forming the plurality of grooves at block 702 entails etching the plurality of grooves in the otherwise flat surface of the metal plate.

According to some examples, the operations 700 further involve attaching the heat management device to a metal mass to form a heat sink assembly (e.g., heat sink assembly 300). In this case, disposing the heat management device above the TIM at block 706 may include disposing the heat sink assembly above the TIM. For some examples, the attaching entails soldering the heat management device to the metal mass. For some examples, the metal mass includes at least one of a vapor chamber, one or more heat pipes embedded in a base plate, or heat sink fins coupled to the base plate.

According to some examples, the plurality of grooves follows a pattern. The pattern may include a first set of the grooves arranged in rows; a second set of the grooves arranged in columns perpendicular to and intersecting the rows at intersections; a third set of the grooves arranged in positive-sloping diagonals intersecting the intersections between the rows and the columns; and/or a fourth set of the grooves arranged in negative-sloping diagonals intersecting the same intersections.

Certain examples of the present disclosure provide a heat management device comprising a textured surface having a plurality of grooves disposed in an otherwise flat surface, a combined area of regions with the grooves in the textured surface being significantly smaller than a combined area of regions with the flat surface.

According to some examples, the device comprises a metal block.

According to some examples, the plurality of grooves is etched in the otherwise flat surface to form the textured surface.

According to some examples, the plurality of grooves follows a pattern. For some examples, the pattern comprises a first set of the grooves arranged in rows and a second set of the grooves arranged in columns perpendicular to and intersecting the rows at intersections. In some cases, the pattern further comprises a third set of the grooves arranged in positive-sloping diagonals intersecting the intersections between the rows and the columns and a fourth set of the grooves arranged in negative-sloping diagonals intersecting the same intersections. For some examples, the intersections have a greater depth than a depth of the plurality of grooves. For some examples, a depth of the plurality of grooves is at least 0.1 mm. A depth of the intersections may be at least 0.2 mm.

According to some examples, the heat management device further includes a plurality of nanotubes arranged in the plurality of grooves. For some examples, a height of the nanotubes is less than 95% of a depth of the plurality of grooves.

Certain examples of the present disclosure provide an IC package. The IC package generally includes a package substrate, one or more IC dies disposed above the package substrate, a TIM disposed above the IC dies, and a heat management device disposed above the TIM. The heat management device generally includes a textured surface having a plurality of grooves disposed in an otherwise flat surface, a combined area of regions with the grooves in the textured surface being significantly smaller than a combined area of regions with the flat surface.

According to some examples, the IC package further includes a heat sink assembly disposed above the heat management device. For some examples, the heat sink assembly comprises a vapor chamber or a heat pipe.

According to some examples, the TIM in conjunction with the textured surface of the heat management device are configured to drive trapped gas out of the regions with the flat surface and into the plurality of grooves. For some examples, the heat management device further includes a plurality of nanotubes arranged in the plurality of grooves, the plurality of nanotubes being configured to divide bubbles of gas trapped between the TIM and the heat management device into smaller bubbles.

According to some examples, the TIM comprises a phase-change material (PCM). For some examples, the PCM comprises one or more hydrocarbon polymers. In this case, at least one of the polymers may include at least 90% metal powder and ceramic filler by weight. For some examples, the one or more polymers have a maximum particle size of 25 μm.

According to some examples, the TIM comprises one or more polymers and metal particles.

According to some examples, the TIM is configured to act as a Newtonian fluid when a surface of the one or more IC dies reaches at least 40° C.

According to some examples, the IC package further includes a heat sink assembly disposed above the TIM, wherein the heat sink assembly comprises the heat management device.

According to some examples, the plurality of grooves follows a pattern comprising a first set of the grooves arranged in rows, a second set of the grooves arranged in columns perpendicular to and intersecting the rows at intersections, a third set of the grooves arranged in positive-sloping diagonals intersecting the intersections between the rows and the columns, and a fourth set of the grooves arranged in negative-sloping diagonals intersecting the same intersections.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A heat management device comprising a textured surface having a plurality of grooves disposed in an otherwise flat surface, a combined area of regions with the grooves in the textured surface being significantly smaller than a combined area of regions with the flat surface, and a plurality of small elongated structures extending from the textured surface into the plurality of grooves.

2. The heat management device of claim 1, wherein the plurality of grooves is etched in the otherwise flat surface to form the textured surface.

3. The heat management device of claim 1, wherein the plurality of grooves follows a pattern.

4. The heat management device of claim 3, wherein the pattern comprises a first set of the grooves arranged in rows and a second set of the grooves arranged in columns perpendicular to and intersecting the rows at intersections.

5. The heat management device of claim 4, wherein the pattern further comprises a third set of the grooves arranged in positive-sloping diagonals intersecting the intersections between the rows and the columns and a fourth set of the grooves arranged in negative-sloping diagonals intersecting the same intersections.

6. The heat management device of claim 4, wherein the intersections have a greater depth than a depth of the plurality of grooves.

7. The heat management device of claim 1, wherein the small elongated structures further comprise a plurality of nanotubes arranged in the plurality of grooves.

8. The heat management device of claim 7, wherein a height of the nanotubes is less than 95% of a depth of the plurality of grooves.

9. An integrated circuit (IC) package comprising:
    a package substrate;
    one or more IC dies disposed above the package substrate;
    a thermal interface material (TIM) disposed above the IC dies; and
    a heat management device disposed above the TIM and comprising a textured surface having a plurality of grooves disposed in an otherwise flat surface, a combined area of regions with the grooves in the textured surface being significantly smaller than a combined area of regions with the flat surface, and a plurality of small elongated structures extending from the textured surface into the plurality of grooves.

10. The IC package of claim 9, further comprising a heat sink assembly disposed above the heat management device.

11. The IC package of claim 10, wherein the heat sink assembly comprises a vapor chamber or a heat pipe.

12. The IC package of claim 9, wherein the TIM in conjunction with the textured surface of the heat management device are configured to drive trapped gas out of the regions with the flat surface and into the plurality of grooves.

13. The IC package of claim 12, wherein the heat management device further comprises a plurality of nanotubes arranged in the plurality of grooves, the plurality of nanotubes being configured to divide bubbles of gas trapped between the TIM and the heat management device into smaller bubbles.

14. The IC package of claim 9, wherein:
    the TIM comprises one or more polymers and metal particles;
    the metal particles have a maximum particle size of 25 µm; and
    the TIM is configured to act as a Newtonian fluid when a surface of the one or more IC dies reaches at least 40° C.

15. The IC package of claim 9, further comprising a heat sink assembly disposed above the TIM, wherein the heat sink assembly comprises the heat management device.

16. The IC package of claim 9, wherein the plurality of grooves follows a pattern comprising:
    a first set of the grooves arranged in rows;
    a second set of the grooves arranged in columns perpendicular to and intersecting the rows at intersections;
    a third set of the grooves arranged in positive-sloping diagonals intersecting the intersections between the rows and the columns; and
    a fourth set of the grooves arranged in negative-sloping diagonals intersecting the same intersections.

17. A method of fabricating an integrated circuit (IC) package, comprising:
    forming a plurality of grooves in an otherwise flat surface of a metal plate to form a heat management device having a textured surface;
    disposing a thermal interface material (TIM) above one or more IC dies disposed above a package substrate; and
    disposing the heat management device above the TIM, wherein a combined area of regions with the grooves in the textured surface is significantly smaller than a combined area of regions with the flat surface; and
    forming a plurality of small elongated structures extending from the textured surface into the plurality of grooves.

18. The method of claim 17, further comprising attaching the heat management device to a metal mass to form a heat sink assembly, wherein:
    disposing the heat management device above the TIM comprises disposing the heat sink assembly above the TIM; and
    the metal mass comprises at least one of a vapor chamber, one or more heat pipes embedded in a base plate, or heat sink fins coupled to the base plate.

19. The method of claim 18, wherein the attaching comprises soldering the heat management device to the metal mass.

20. The method of claim 17, wherein forming the plurality of grooves comprises etching the plurality of grooves in the otherwise flat surface of the metal plate.

* * * * *